(12) United States Patent
Chen et al.

(10) Patent No.: US 8,299,821 B2
(45) Date of Patent: Oct. 30, 2012

(54) INTEGRATED GATE DRIVER CIRCUIT

(75) Inventors: Yan Jou Chen, Tainan County (TW); Hsien Cheng Chang, Changhua County (TW)

(73) Assignee: Hannstar Display Corp., Taipei County (TW)

( * ) Notice: Subject to any disclaimer, the term of this patent is extended or adjusted under 35 U.S.C. 154(b) by 367 days.

(21) Appl. No.: 12/781,967

(22) Filed: May 18, 2010

(65) Prior Publication Data
US 2010/0289535 A1 Nov. 18, 2010

(30) Foreign Application Priority Data
May 18, 2009 (TW) .............................. 98116394 A

(51) Int. Cl.
*H03B 1/00* (2006.01)

(52) U.S. Cl. ........ 327/108; 327/112; 327/170; 327/379; 326/21; 326/82

(58) Field of Classification Search .......... 327/108–112, 327/170, 374–377, 379, 284; 326/21–24, 326/82–84, 89
See application file for complete search history.

(56) References Cited

U.S. PATENT DOCUMENTS
2006/0221041 A1 * 10/2006 Cho et al. ...................... 345/100
* cited by examiner

*Primary Examiner* — Lincoln Donovan
*Assistant Examiner* — Shikha Goyal

(57) ABSTRACT

An integrated gate driver circuit includes an output drive circuit and a voltage stabilizing circuit. The voltage stabilizing circuit is configured to stabilize an output voltage outputted by the output drive circuit thereby reducing the ripple of the output voltage.

20 Claims, 6 Drawing Sheets

INTEGRATED GATE DRIVER CIRCUIT

CROSS REFERENCE TO RELATED APPLICATION

This application claims the priority benefit of Taiwan Patent Application Serial Number 098116394, filed on May 18, 2009, the full disclosure of which is incorporated herein by reference.

BACKGROUND

1. Field of the Invention

This invention generally relates to a liquid crystal display and, more particularly, to an integrated gate driver circuit of a liquid crystal display.

2. Description of the Related Art

A liquid crystal display controls the operation of every pixel through a plurality of gate driver circuits and source driver circuits to display images thereon. In order to improve the quality of images displayed by a liquid crystal display, the resolution thereof is increased rapidly and therefore more drive circuits are required so as to drive the liquid crystal display such that the manufacturing cost is significantly increased.

Please refer to FIG. 1, it shows a schematic diagram of a conventional liquid crystal display, wherein the gate driver circuit of a liquid crystal display 9 and a pixel matrix 91 may be simultaneously manufactured on the same substrate so as to reduce the manufacturing cost. This kind of gate driver circuit is called integrated gate driver circuit 92. The integrated gate driver circuit 92 is formed by a plurality of cascaded drive units.

Please refer to FIGS. 2a and 2b, FIG. 2a shows a circuit diagram of a drive unit 920 of the integrated gate driver circuit and FIG. 2b shows an operational timing diagram of the drive unit 920. The drive unit 920 receives an input signal "Input", a first clock signal $CK_1$ and a second clock signal $CK_2$; and outputs an output signal "Output".

Within a first time period $t_1$, the first clock signal $CK_1$ turns on the first switch $T_1$ and the third switch $T_3$ at the same time. In this period, the voltage of a node X switches from a low level to a high level to turn on the second switch $T_2$. Since the second clock signal $CK_2$ is at a low level within this period, the drive unit 920 outputs a low level output signal "Output".

Within a second period $t_2$, the second clock signal $CK_2$ switches from a low level to a high level. Since the voltage of the node X is still at a high level in this period, the drive unit 920 outputs a high level output signal "Output", wherein the output signal "Output" also serves as the input signal of an immediately following drive unit of the drive unit 920.

Within a third period $t_3$, the first clock signal $CK_1$ turns on the first switch $T_1$ and the third switch $T_3$ again at the same time. In this period, voltages of the node X and the output signal "Output" change to a low level. Within a fourth period $t_4$, the second clock signal $CK_2$ changes to a high level again, and the voltage of the node X interacts with the stray capacitance of the second switch $T_2$ through coupling effect to generate ripples thereon, resulting in ripples on the output signal "Output".

Accordingly, it is necessary to further provide an integrated gate driver circuit that has better output driving characteristics so as to avoid malfunction of a liquid crystal display.

SUMMARY

The present invention provides an integrated gate driver circuit, wherein the ripple of an output signal outputted by the integrated gate driver circuit may be reduced by disposing a voltage stabilizing circuit.

The present invention provides an integrated gate driver circuit that receives a plurality of clock signals and includes a plurality of cascaded drive units. Each drive unit includes an input terminal, an output terminal, an output drive circuit and a first voltage stabilizing circuit. The output drive circuit includes a first switch, a second switch and a third switch. The first switch includes a control terminal receiving a first clock signal, a first terminal coupled to the input terminal, and a second terminal coupled to a first node. The second switch includes a control terminal coupled to the first node, a first terminal receiving a second clock signal, and a second terminal coupled to the output terminal. The third switch includes a control terminal receiving the first clock signal, a first terminal coupled to the output terminal, and a second terminal coupled to a first voltage. The first voltage stabilizing circuit includes a fourth switch, a fifth switch and a sixth switch. The fourth switch includes a first terminal coupled to a second voltage, a second terminal coupled to a second node, and a control terminal coupled to the first terminal of the fourth switch. The fifth switch includes a first terminal coupled to the second node, a second terminal coupled to the first voltage, and a control terminal coupled to the output terminal. The sixth switch includes a first terminal coupled to the output terminal, a second terminal coupled to the first voltage, and a control terminal coupled to the second node.

The present invention further provides an integrated gate driver circuit that receives a plurality of clock signals and includes a plurality of identical and cascaded drive units. Each drive unit includes an input terminal, an output terminal, an output drive circuit and a voltage stabilizing circuit. The output drive circuit includes a first switch, a second switch and a third switch. The first switch includes a control terminal receiving a first clock signal, a first terminal coupled to the input terminal, and a second terminal coupled to a first node. The second switch includes a control terminal coupled to the first node, a first terminal receiving a second clock signal, and a second terminal coupled to the output terminal. The third switch includes a control terminal receiving the first clock signal, a first terminal coupled to the output terminal, and second terminal coupled to a voltage source. The voltage stabilizing circuit includes a tenth switch, an eleventh switch, a twelfth switch and a thirteenth switch. The tenth switch includes a first terminal coupled to the output terminal, a second terminal coupled to the voltage source, and a control terminal coupled to a second node. The eleventh switch includes a first terminal coupled to the second node, a second terminal coupled to the voltage source, and a control terminal coupled to the first node. The twelfth switch includes a first terminal coupled to the second node, a second terminal coupled to the first node of an immediately following drive unit, and a control terminal coupled to the second terminal. The thirteenth switch includes a first terminal coupled to the first node, a second terminal coupled to the voltage source, and a control terminal coupled to the second node.

The present invention further provides an integrated gate driver circuit that receives a plurality of clock signals and includes a plurality of cascaded drive units. Each drive unit includes an input terminal, an output terminal, an output drive circuit and a balancing capacitor. The output drive circuit includes a first switch, a second switch and a third switch. The first switch includes a control terminal receiving a first clock signal, a first terminal coupled to the input terminal, and a second terminal coupled to a node. The second switch includes a control terminal coupled to the node, a first terminal receiving a second clock signal, and a second terminal coupled to the output terminal. The third switch includes a control terminal receiving the first clock signal, a first terminal coupled to the output terminal, and a second terminal coupled to a voltage source. The balancing capacitor is coupled to between the node and the control terminal of the third switch.

The present invention further provides an integrated gate driver circuit that receives a plurality of clock signals and includes a plurality of cascaded drive units. Each drive unit includes an output drive circuit and a first voltage stabilizing circuit. The output drive circuit includes an output terminal. The first voltage stabilizing circuit includes a fourth switch, a fifth switch and a sixth switch. The fourth switch includes a first terminal coupled to a high voltage, a second terminal coupled to a second node, and a control terminal coupled to the first terminal of the fourth switch. The fifth switch includes a first terminal coupled to the second node, a second terminal coupled to a low voltage, and a control terminal coupled to the output terminal. The sixth switch includes a first terminal coupled to the output terminal, a second terminal coupled to the low voltage, and a control terminal coupled to the second node; wherein when the output terminal of the output drive circuit is at a high voltage level, the fifth switch is turned on while the sixth switch is turned off thereby maintaining the output terminal at the high voltage level; when the output terminal of the output drive circuit is at a low voltage level, the fifth switch is turned off while the sixth switch is turned on thereby maintaining the output terminal at the low voltage level.

In the integrated gate driver circuit of the present invention, an output voltage of the output drive circuit included in the integrated gate driver circuit is stabilized by disposing a voltage stabilizing circuit to avoid malfunction of a liquid crystal display.

BRIEF DESCRIPTION OF THE DRAWINGS

Other objects, advantages, and novel features of the present invention will become more apparent from the following detailed description when taken in conjunction with the accompanying drawings.

FIG. 2b shows an operational timing diagram of the integrated gate driver circuit shown in FIG. 2a.

FIG. 3b shows a block diagram of a drive unit of the integrated gate driver circuit shown in FIG. 3a.

FIG. 4b shows an operational timing diagram of the drive unit shown in FIG. 4a.

FIG. 5a shows a circuit diagram of a drive unit of the integrated gate driver circuit in accordance with another embodiment of the present invention.

FIG. 5b shows an operational diagram of the drive unit shown in FIG. 5a.

DETAILED DESCRIPTION OF THE EMBODIMENT

It should be noticed that, wherever possible, the same reference numbers will be used throughout the drawings to refer to the same or like parts.

Figure 1:
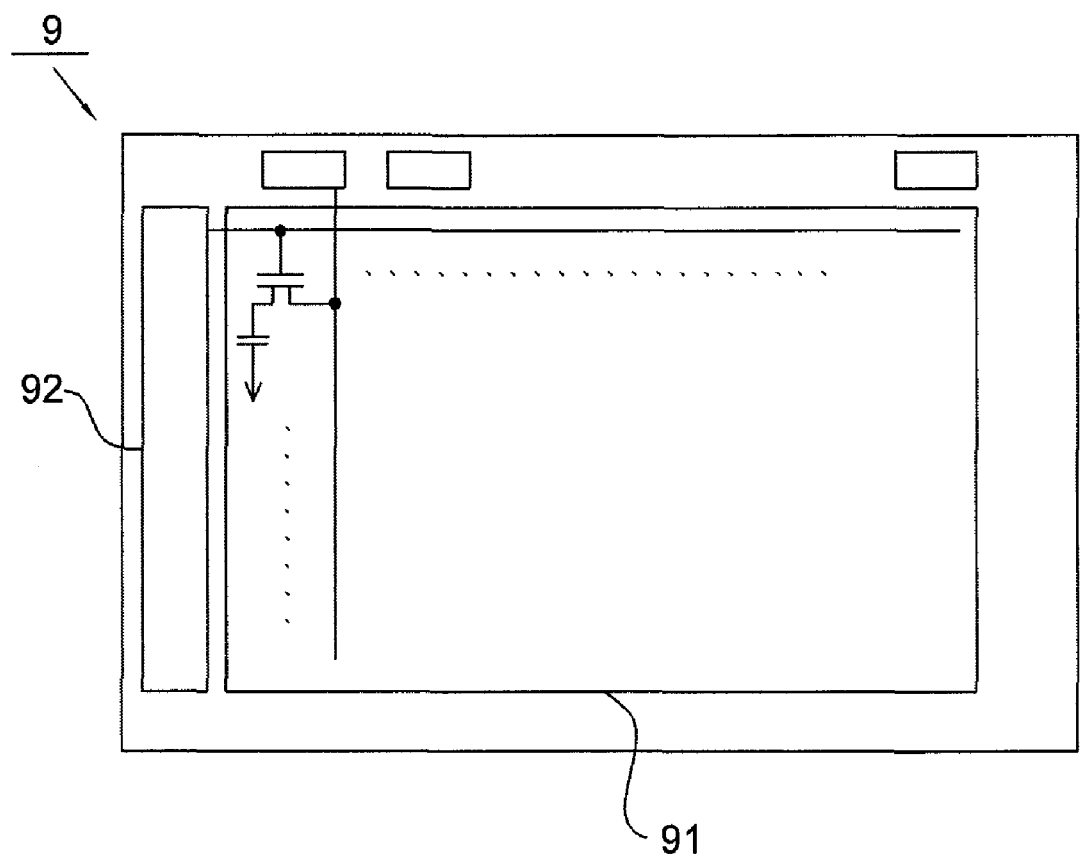
FIG. 1 shows a schematic diagram of a conventional liquid crystal display.
Figure 2A:
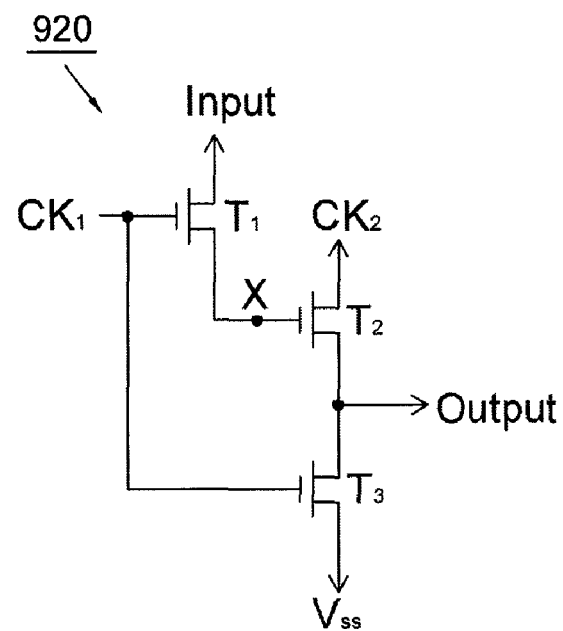
FIG. 2a shows a circuit diagram of a conventional integrated gate driver circuit.
Figure 2B:
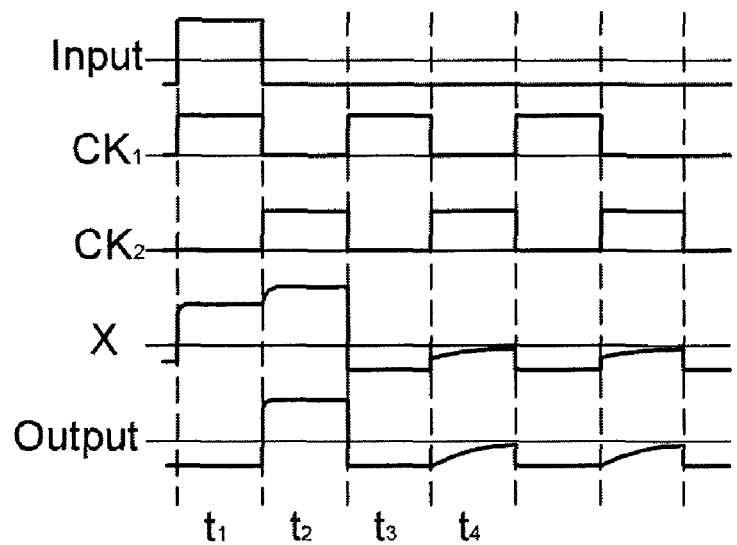
Figure 3A:
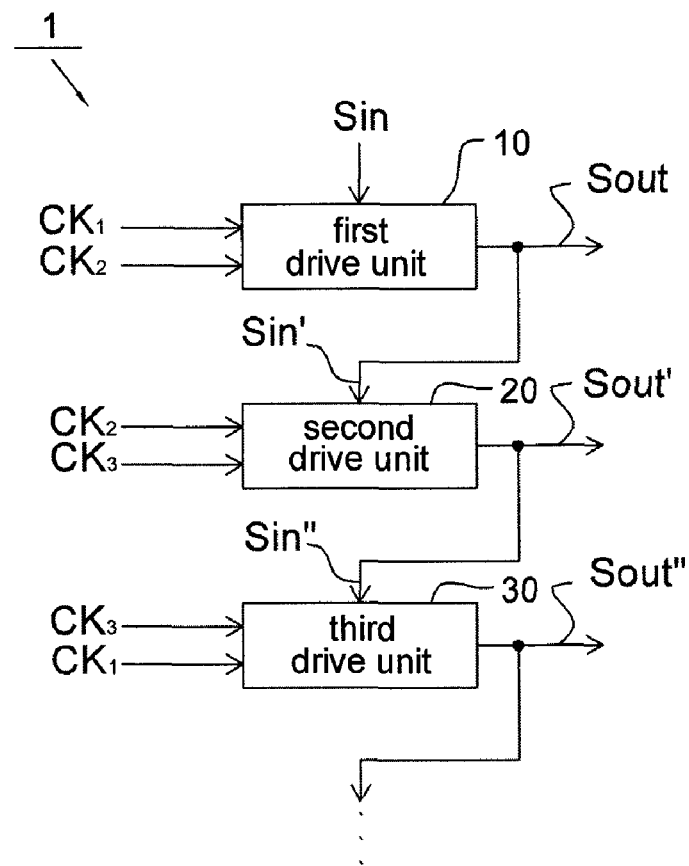
FIG. 3a shows a block diagram of the integrated gate driver circuit in accordance with an embodiment of the present invention.

Please refer to FIG. 3a, it shows a block diagram of the integrated gate driver circuit 1 in accordance with an embodiment of the present invention. The integrated gate driver circuit 1 includes a plurality of identical and cascaded drive units, e.g. a first drive unit 10 (assuming it is the first stage drive unit), a second drive unit 20 and a third drive unit 30. Each drive unit receives an input signal and a plurality of clock signals, and outputs an output signal served as the input signal of an immediately following drive unit. For example, the first drive unit 10 receives two clock signals $CK_1$, $CK_2$ and an input signal Sin, and outputs an output signal Sout, which is served as the input signal Sin' of the second drive unit 20; wherein the clock signals $CK_1$, $CK_2$ and $CK_3$ are provided by a clock generator (not shown), and the clock generator may or may not be included in the integrated gate drive circuit 1.

Next, the first drive unit 10 is served as an example to illustrate the circuit diagram and the operation of every drive unit, and other drive units are similar to the first drive unit 10. In addition, in the illustration of the present invention, a high level may be 17 volts while a low level may be −10 volts, but these values are not a limitation of the present invention. The switch referred herein may be a thin film transistor or a semiconductor switching element.

Figure 3B:
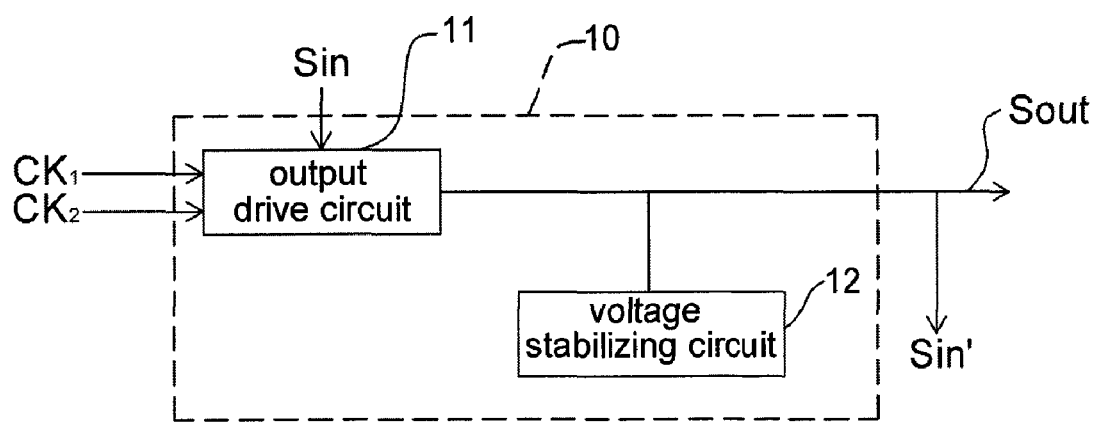

Please refer to FIG. 3b, the first drive unit 10 includes an output drive circuit 11 and a voltage stabilizing circuit 12. The output drive circuit 11 receives two clock signals $CK_1$, $CK_2$ and an input signal Sin, and outputs an output signal Sout; wherein the output signal Sout is also served as the input signal Sin' of an immediately following drive unit (e.g. the second drive unit 20). The voltage stabilizing circuit 12 is configured to stabilize the output signal Sout. The clock signal $CK_1$ has a phase difference with respect to the clock signal $CK_2$.

Figure 4A:
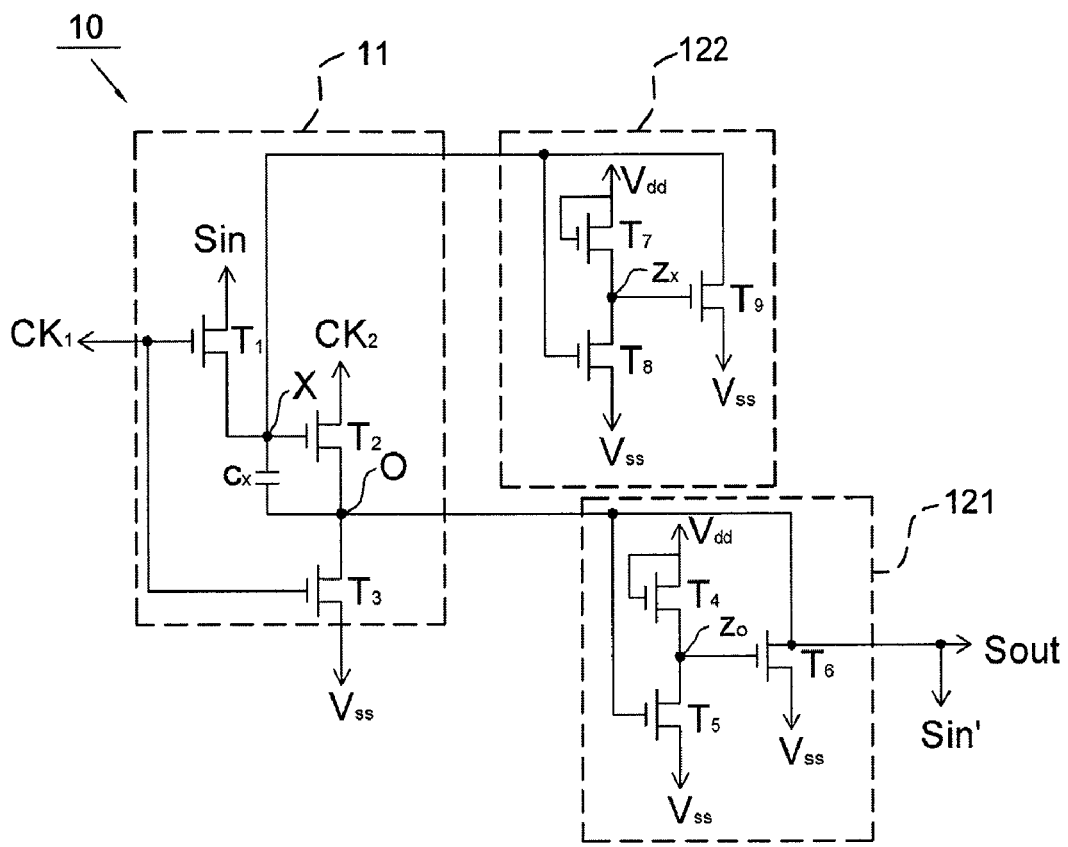
FIG. 4a shows a circuit diagram of a drive unit of the integrated gate driver circuit in accordance with an embodiment of the present invention.

Please refer to FIG. 4a, it shows an embodiment of the circuit diagram of the first drive unit 10 that includes an output drive circuit 11, a first voltage stabilizing circuit 121 and a second voltage stabilizing circuit 122. The output drive circuit 11 includes a first switch $T_1$, a second switch $T_2$, a third switch $T_3$ and a capacitor Cx. A control terminal of the first switch $T_1$ receives the first clock signal $CK_1$. The first switch $T_1$ includes a first terminal receiving an input signal Sin, and a second terminal coupled to a node X. A control terminal of the second switch $T_2$ is coupled to the node X. The second switch $T_2$ includes a first terminal receiving the second clock signal $CK_2$. A control terminal of the third switch $T_3$ is coupled to the control terminal of the first switch $T_1$ to receive the first clock signal $CK_1$. The third switch $T_3$ includes a first terminal coupled to a second terminal of the second switch $T_2$, and a second terminal coupled to a voltage source $V_{SS}$, e.g. a −10 volts low voltage source; wherein a connection of the second switch $T_2$ and the third switch $T_3$ is served as the output terminal O of the output drive circuit 11 (i.e. the output terminal of the first drive unit 10). The capacitor Cx is coupled to between the node X and the output terminal O of the output drive circuit 11 so as to reduce the coupling effect between signals and stray capacitances of the first switch $T_1$ and the second switch $T_2$. However, the capacitor Cx may not be implemented in the present invention.

In this embodiment, the first voltage stabilizing circuit 121 is coupled to the output terminal O of the output drive circuit 11 to stabilize the output signal Sout of the first drive unit 10. The second voltage stabilizing circuit 122 is coupled to the node X of the output drive circuit 11 to stabilize the voltage of the node X. The first voltage stabilizing circuit 121 includes a fourth switch $T_4$, a fifth switch $T_5$ and a sixth switch $T_6$. The fourth switch $T_4$ includes a first terminal coupled to a voltage source $V_{dd}$, e.g. a 17 volts high voltage source; and a second terminal coupled to a node $Z_0$. A control terminal of the fourth switch $T_4$ is coupled to the first terminal thereof. A control terminal of the fifth switch $T_5$ is coupled to the output terminal O of the output drive circuit 11. The fifth switch $T_5$ includes a first terminal coupled to the node $Z_0$, and a second terminal coupled to the voltage source $V_{SS}$. A control terminal of the sixth switch $T_6$ is coupled to the node $Z_0$. The sixth switch $T_6$ includes a first terminal coupled to the output terminal O of the output drive circuit 11, and a second terminal coupled to the voltage source $V_{SS}$.

The second voltage stabilizing circuit 122 includes a seventh switch $T_7$, an eighth switch $T_8$ and a ninth switch $T_9$. The seventh switch $T_7$ includes a first terminal coupled to the voltage source $V_{dd}$, and a second terminal coupled to a node $Z_X$. A control terminal of the seventh switch $T_7$ is coupled to the first terminal thereof. A control terminal of the eighth switch $T_8$ is coupled to the node X of the output drive circuit 11. The eighth switch $T_8$ includes a first terminal coupled to the node $Z_X$, and a second terminal coupled to the voltage source $V_{SS}$. A control terminal of the ninth switch $T_9$ is coupled to the node $Z_X$. The ninth switch $T_9$ includes a first terminal coupled to the node X of the output drive circuit 11, and a second terminal coupled to the voltage source $V_{SS}$.

Figure 4B:
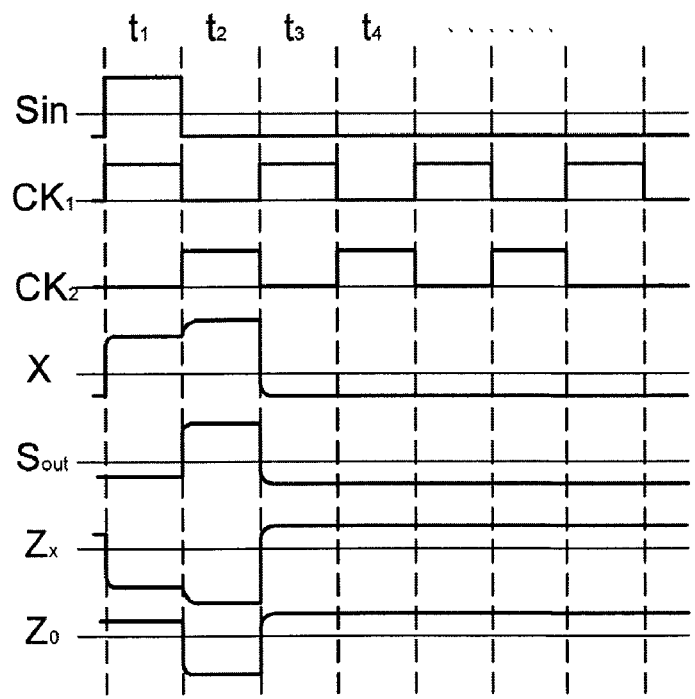

Please refer to FIGS. 4a and 4b, FIG. 4b is an operational timing diagram of FIG. 4a. Within a first period $t_1$, the first clock signal $CK_1$ with a high level is inputted to the control terminals of the first switch $T_1$ and third switch $T_3$ simultaneously; and the first terminal of the first switch $T_1$ receives the input signal Sin at a high level. In this period, the first switch $T_1$ and the third switch $T_3$ are turned on. Accordingly, a voltage of the node X changes to a high level to turn on the eighth switch $T_8$ such that a voltage of the node $Z_X$ discharges to a low level. The output signal Sout maintains at a low level to turn off the fifth switch $T_5$ such that the node $Z_0$ maintains at a high level.

Within a second period $t_2$, the second clock signal $CK_2$ at a high level is inputted to the first terminal of the second switch $T_2$; and the first clock signal $CK_1$ and the input signal Sin change to a low level. In this period, the first switch $T_1$ and the third switch $T_3$ are turned off while the second switch $T_2$ is turned on. Accordingly, the voltage of the node X maintains at a high level to turn on the eighth switch $T_8$ such that the voltage of the node $Z_X$ maintains at a low level. The output signal Sout changes to a high level to turn on the fifth switch $T_5$ such that the voltage of the node $Z_0$ changes to a low level.

With a third period $t_3$, the input signal Sin maintains at a low level; the first clock signal $CK_1$ changes to a high level; and the second clock signal $CK_2$ changes to a low level. In this period, the first switch $T_1$ and the third switch $T_3$ are turned on again. Accordingly, the voltage of the node X discharges to a low level to turn off the eighth switch $T_8$ such that the voltage of the node $Z_X$ changes to a high level. The output signal Sout is at a low level to turn off the fifth switch $T_5$ such that the voltage of the node $Z_0$ changes to a high level to turn on the sixth switch $T_6$ to maintain the output signal Sout at a low level.

With a fourth period $t_4$, the input signal Sin maintains at a low level; the first clock signal $CK_1$ changes to a low level; and the second clock signal $CK_2$ changes to a high level. In this period, the first switch $T_1$, the second switch $T_2$ and the third switch $T_3$ are all turned off. In this period, as the second clock signal $CK_2$ changes from a low level to a high level, the stray capacitance of the second switch $T_2$ will cause the voltage of the node X to fluctuate through coupling effect and further cause the voltage of the output signal Sout to fluctuate. Therefore in the present invention, by using the first voltage stabilizing circuit 121, the voltage fluctuation of the output signal Sout may be reduced to maintain the voltage of the output signal Sout at a low level through the sixth switch $T_6$ of the first voltage stabilizing circuit 121; and the voltage fluctuation of the node X may be reduced to maintain the voltage of the node X at a low level through the ninth switch $T_9$ of the second voltage stabilizing circuit 122. In the present embodiment, through disposing the first voltage stabilizing circuit 121 and/or the second voltage stabilizing circuit 122, the voltage of the output signal Sout of the first drive unit 10 may be effectively stabilized. In an embodiment, the first drive unit 10 may only include the first voltage stabilizing circuit 121. In addition, the capacitor $C_X$ is configured to reduce the coupling effect between signals and stray capacitances of the first switch $T_1$ and the second switch $T_2$.

Figures 5A, 5B:
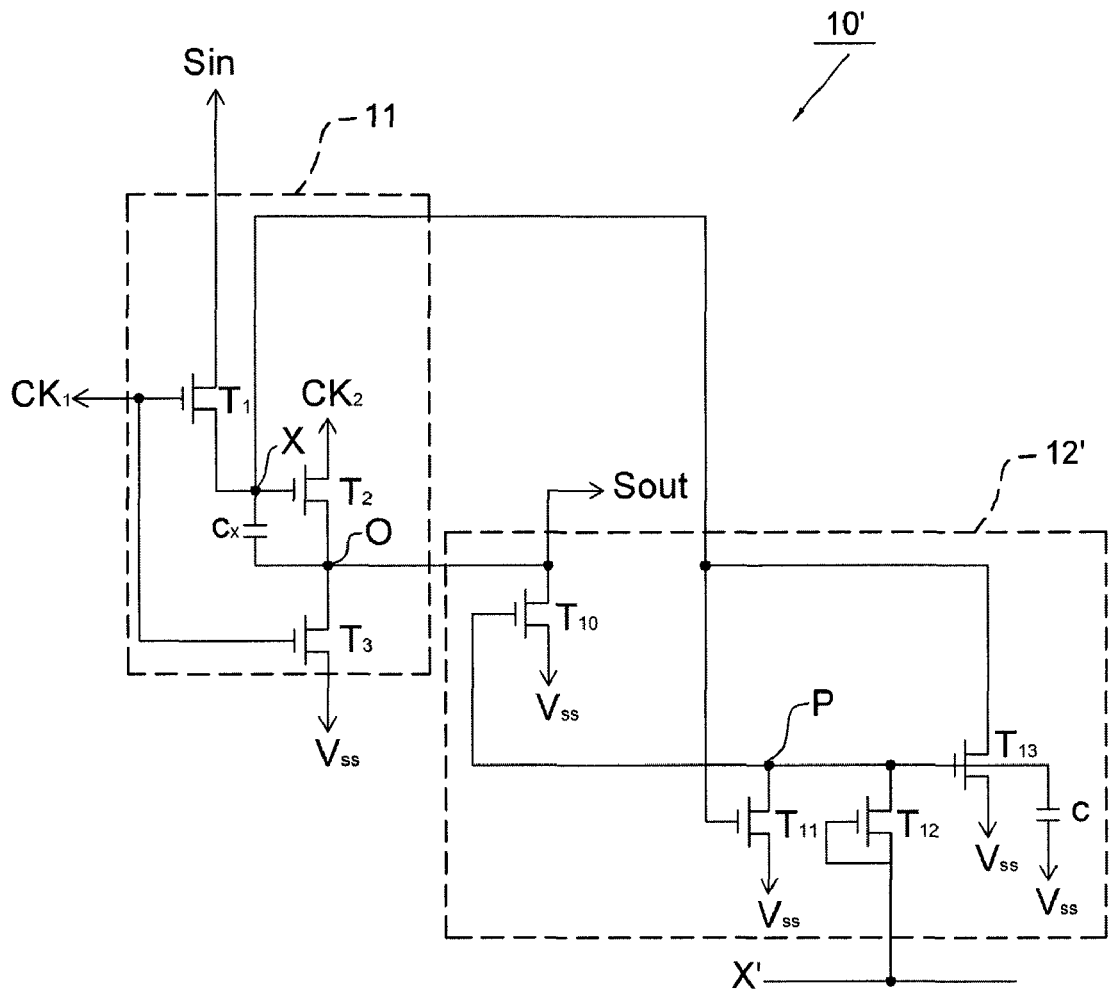

Please refer to FIG. 5a, it shows a circuit diagram of the first drive unit according to another embodiment of the present invention. The first drive unit 10' includes an output drive circuit 11 and a voltage stabilizing circuit 12'. In this embodiment, the output drive circuit 11 is identical to that shown in FIG. 4a, and thus details will not be repeated herein. The voltage stabilizing circuit 12' is coupled to between the node X and the output terminal O of the output drive circuit 11 for stabilizing voltages of the node X and the output terminal O.

The voltage stabilizing circuit 12' includes a tenth switch $T_{10}$, a eleventh switch $T_{11}$, a twelfth switch $T_{12}$ and a thirteenth switch $T_{13}$. A control terminal of the tenth switch $T_{10}$ is coupled to a node P. The tenth switch $T_{10}$ includes a first terminal coupled to the output terminal O of the output drive circuit 11, and a second terminal coupled to a voltage source $V_{SS}$, e.g. a $-10$ volts low voltage source. The tenth switch $T_{10}$ is configured to stabilize the voltage of the output terminal O of the output drive circuit 11. A control terminal of the eleventh switch $T_{11}$ is coupled to the node X of the output drive circuit 11. The eleventh switch $T_{11}$ includes a first terminal coupled to the node P, and a second terminal coupled to the voltage source $V_{SS}$. The twelfth switch $T_{12}$ includes a first terminal coupled to the node P, a second terminal coupled to a signal source X', which is the node X' of an immediately following drive unit of the first drive unit 10', and a control terminal coupled to the second terminal thereof. A control terminal of the thirteenth switch $T_{13}$ is coupled to the node P. The thirteenth switch $T_{13}$ includes a first terminal coupled to the node X of the output drive circuit 11, and a second terminal coupled to the voltage source $V_{SS}$. The voltage stabilizing circuit 12' may further include a capacitor C coupled to between the node P and the voltage source $V_{SS}$ for maintaining the voltage of the node P.

Please refer to FIG. 5b, it shows an operational diagram of the first drive unit 10' shown in FIG. 5a, wherein "1" refers to a high level while "0" refers to a low level. Within a first period $t_1$, an input signal Sin at a high level is inputted to the first terminal of the first switch $T_1$; a second clock signal $CK_2$ at a low level is inputted to the first terminal of the second switch $T_2$; and a first clock signal $CK_1$ at a high level is inputted to the control terminals of the first switch $T_1$ and third switch $T_3$ simultaneously to turn on the first switch $T_1$ and third switch $T_3$ at the same time. Accordingly, a voltage of the node X changes to a high level to turn on the second switch $T_2$ and the eleventh switch $T_{11}$ such that a voltage of the node P discharges to a low level to turn off the tenth switch $T_{10}$. The signal source X' is at a low level in this period to turn off the twelfth switch $T_{12}$ such that the voltage of the node P maintains at a low level to turn off the thirteenth switch $T_{13}$. Accordingly, the voltage of the node X may be maintained at a high level and the output signal Sout may be maintained at a low level.

Within a second period $t_2$, the input signal Sin and the first clock signal $CK_1$ changes from a high level to a low level; and the second clock signal $CK_2$ changes from a low level to a high level. Accordingly, the first switch $T_1$ and the third switch $T_3$ are turned off, and the voltage of the node X still maintains at a high level to turn on the second switch $T_2$ such that the output signal Sout changes to a high level. In this period, the eleventh switch $T_{11}$ is turned on to maintain the voltage of the node P at a low level to turn off the tenth switch $T_{10}$. In this period, the signal source X' is at a high level to turn on the twelfth switch $T_{12}$ to maintain the voltage of the node P at a low level to turn off the thirteenth switch $T_{13}$. Accordingly, the voltage of the node X may maintain at a high level to maintain the output signal Sout at a high level.

Within a third period $t_3$, the input signal Sin is still at a low level; the first clock signal $CK_1$ changes to a high level; and the second clock signal $CK_2$ changes to a low level. Accordingly, the first switch $T_1$ and the third switch $T_3$ are turned on again such that the voltage of the node X discharges to a low level to turn off the second switch $T_2$ and the eleventh switch $T_{11}$. The output signal Sout discharges to a low level. In this period, the signal source X' is at a high level to turn on the twelfth switch $T_{12}$ such that the voltage of the node P changes to a high level to turn on the thirteenth switch $T_{13}$ so as to maintain the voltage of the node X at a low level. In this period, the tenth switch $T_{10}$ is also turned on to maintain the output signal Sout at a low level.

Within a fourth period $t_4$, the input signal Sin is still at a low level; the first clock signal $CK_1$ changes to a low level; and the second clock $CK_2$ signal changes to a high level. In this period, the first switch $T_1$, the second switch $T_2$ and the third switch $T_3$ are all turned of. In this period, the voltage of the node X is still at a low level to turn off the eleventh switch $T_{11}$; and the output signal Sout still maintains at a low level. In this period, the signal source X' changes to a low level to turn of the twelfth switch $T_{12}$ such that the voltage of the node P maintains at a high level to turn on the thirteenth switch $T_{13}$ so as to maintain the voltage of the node X at a low level. In this period, the tenth switch $T_{10}$ is turned on to maintain the output voltage Sout at a low level. In the present invention, through disposing the voltage stabilizing circuit 12', the voltage fluctuation of the node X may be reduced to maintain the voltage of the node X at a low level through the thirteenth switch $T_{13}$ of the voltage stabilizing circuit 12'; and the voltage fluctuation of the output signal Sout may be reduced to maintain the voltage of the output signal Sout at a low level through the tenth switch $T_{10}$ of the voltage stabilizing circuit 12'. In the present embodiment, through disposing the voltage stabilizing circuit 12', the output voltage of the output signal Sout of the first drive unit 10' may be effectively stabilized.

Figure 6:
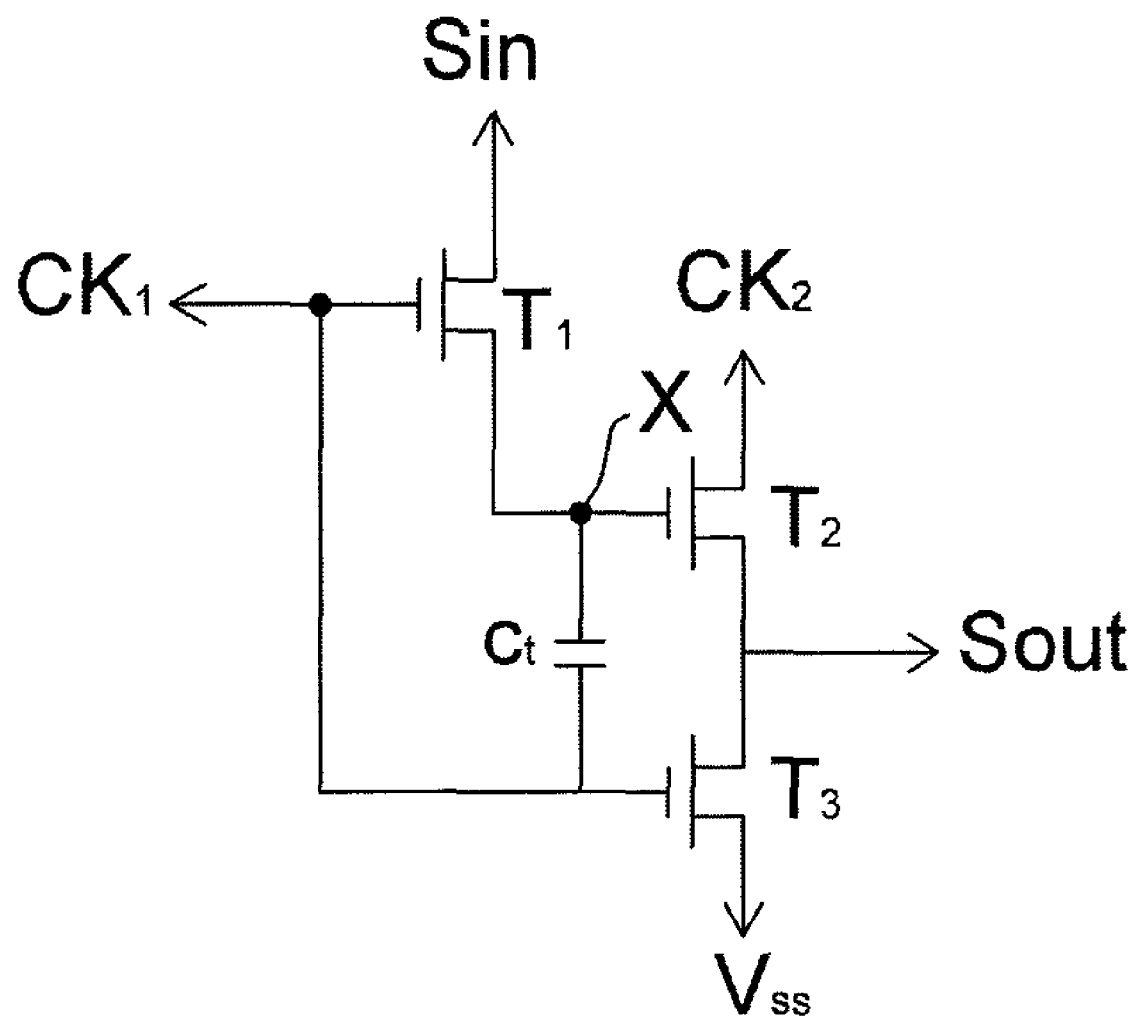
FIG. 6 shows a circuit diagram of a drive unit of the integrated gate driver circuit in accordance with an alternative embodiment of the present invention.

Please refer to FIG. 6, it shows a circuit diagram of the first drive unit in accordance with an alternative embodiment of the present invention. The output drive circuit of the first drive unit 10" is identical to the output drive circuit 11 shown in FIGS. 4a and 5a, and thus details will not be repeated herein. In the present embodiment, a balancing capacitor Ct is further coupled to between the control terminal of the second switch $T_2$ and the control terminal of the third switch $T_3$. Since a voltage variation of the first clock signal $CK_1$ is reverse to that of the second clock signal $CK_2$, a capacitance of the balancing capacitor Ct is set to just eliminate the coupling effect caused by stray capacitance of the first switch $T_1$ during the first clock signal $CK_1$ varying its voltage level and by stray capacitance of the second switch $T_2$ during the second clock signal $CK_2$ varying its voltage level, so as to stabilize the voltage of the node X and further reduce ripples on the output signal Sout.

As mentioned above, as the output of the conventional integrated gate driver circuit includes ripples, which will introduce malfunction of a liquid crystal display. The present invention forms a voltage stabilizing circuit (FIGS. 4a and 5a) or a balancing capacitor (FIG. 6) at the output terminal of an integrated gate driver circuit to eliminate ripples on an output signal outputted by the integrated gate driver circuit.

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. An integrated gate driver circuit, receiving a plurality of clock signals and comprising a plurality of cascaded drive units, each drive unit comprising:
    an input terminal;
    an output terminal;
    an output drive circuit, comprising:
        a first switch, comprising a control terminal receiving a first clock signal, a first terminal coupled to the input terminal, and a second terminal coupled to a first node;
        a second switch, comprising a control terminal coupled to the first node, a first terminal receiving a second clock signal, and a second terminal coupled to the output terminal; and
        a third switch, comprising a control terminal receiving the first clock signal, a first terminal coupled to the output terminal, and a second terminal coupled to a first voltage; and
    a first voltage stabilizing circuit, comprising:
        a fourth switch, comprising a first terminal coupled to a second voltage, a second terminal coupled to a second node, and a control terminal coupled to the first terminal of the fourth switch;
        a fifth switch, comprising a first terminal coupled to the second node, a second terminal coupled to the first voltage, and a control terminal coupled to the output terminal; and
        a sixth switch, comprising a first terminal coupled to the output terminal, a second terminal coupled to the first voltage, and a control terminal coupled to the second node.

2. The integrated gate driver circuit as claimed in claim 1, wherein the output terminal of each drive unit is coupled to the input terminal of an immediately following drive unit.

3. The integrated gate driver circuit as claimed in claim 1, wherein the drive unit further comprises a second voltage stabilizing circuit coupled to the first node.

4. The integrated gate driver circuit as claimed in claim 3, wherein the second voltage stabilizing circuit comprising:
    a seventh switch, comprising a first terminal coupled to the second voltage, a second terminal coupled to a third node, and a control terminal coupled to the first terminal of the seventh switch;
    an eighth switch, comprising a first terminal coupled to the third node, a second terminal coupled to the first voltage, and a control terminal coupled to the first node; and
    a ninth switch, comprising a first terminal coupled to the first node, a second terminal coupled to the first voltage, and a control terminal coupled to the third node.

5. The integrated gate driver circuit as claimed in claim 4, wherein the seventh to ninth switches are thin film transistors.

6. The integrated gate driver circuit as claimed in claim 1, wherein the output drive circuit further comprises a capacitor coupled to between the first node and the output terminal.

7. The integrated gate driver circuit as claimed in claim 1, wherein the first to sixth switches are thin film transistors.

8. The integrated gate driver circuit as claimed in claim 1, wherein the first voltage is lower than the second voltage.

9. The integrated gate driver circuit as claimed in claim 1, wherein the first clock signal has a phase difference with respect to the second clock signal.

10. An integrated gate driver circuit, receiving a plurality of clock signals and comprising a plurality of identical and cascaded drive units, each drive unit comprising:
   an input terminal;
   an output terminal;
   an output drive circuit, comprising:
      a first switch, comprising a control terminal receiving a first clock signal, a first terminal coupled to the input terminal, and a second terminal coupled to a first node;
      a second switch, comprising a control terminal coupled to the first node, a first terminal receiving a second clock signal, and a second terminal coupled to the output terminal; and
      a third switch, comprising a control terminal receiving the first clock signal, a first terminal coupled to the output terminal, and second terminal coupled to a voltage source; and
   a voltage stabilizing circuit, comprising:
      a tenth switch, comprising a first terminal coupled to the output terminal, a second terminal coupled to the voltage source, and a control terminal coupled to a second node;
      an eleventh switch, comprising a first terminal coupled to the second node, a second terminal coupled to the voltage source, and a control terminal coupled to the first node;
      a twelfth switch, comprising a first terminal coupled to the second node, a second terminal coupled to the first node of an immediately following drive unit, and a control terminal coupled to the second terminal; and
      a thirteenth switch, comprising a first terminal coupled to the first node, a second terminal coupled to the voltage source, and a control terminal coupled to the second node.

11. The integrated gate driver circuit as claimed in claim 10, wherein the voltage stabilizing circuit further comprising a capacitor coupled to between the second node and the voltage source.

12. The integrated gate driver circuit as claimed in claim 10, wherein the output terminal of each drive unit is coupled to the input terminal of an immediately following drive unit.

13. The integrated gate driver circuit as claimed in claim 10, wherein the output drive circuit further comprises a capacitor coupled to between the first node and the output terminal.

14. The integrated gate driver circuit as claimed in claim 10, wherein the first to third switches and the tenth to thirteenth switches are thin film transistors.

15. The integrated gate driver circuit as claimed in claim 10, wherein the voltage source is a low voltage source.

16. The integrated gate driver circuit as claimed in claim 10, wherein the first clock signal has a phase difference with respect to the second clock signal.

17. An integrated gate driver circuit, receiving a plurality of clock signals and comprising a plurality of cascaded drive units, each drive unit comprising:
   an input terminal;
   an output terminal;
   an output drive circuit, comprising:
      a first switch, comprising a control terminal receiving a first clock signal, a first terminal coupled to the input terminal, and a second terminal coupled to a node;
      a second switch, comprising a control terminal coupled to the node, a first terminal receiving a second clock signal, and a second terminal coupled to the output terminal; and
      a third switch, comprising a control terminal receiving the first clock signal, a first terminal coupled to the output terminal, and a second terminal coupled to a voltage source; and
   a balancing capacitor, coupled to between the node and the control terminal of the third switch.

18. The integrated gate driver circuit as claimed in claim 17, wherein a capacitance of the balancing capacitor is set to balance the coupling effect induced by the stray capacitance of the first switch and the second switch.

19. The integrated gate driver circuit as claimed in claim 17, wherein the output terminal of each drive unit is coupled to the input terminal of an immediately following drive unit.

20. The integrated gate driver circuit as claimed in claim 17, wherein the first clock signal has a phase difference with respect to the second clock signal.

* * * * *